United States Patent [19]

Lorenzo et al.

[11] Patent Number: 4,884,112
[45] Date of Patent: Nov. 28, 1989

[54] SILICON LIGHT-EMITTING DIODE WITH INTEGRAL OPTICAL WAVEGUIDE

[75] Inventors: Joseph P. Lorenzo, Stow; Richard A. Soref, Newton Centre, both of Mass.

[73] Assignee: The United States of America as repressented by the Secretary of the Air Force, Washington, D.C.

[21] Appl. No.: 170,172

[22] Filed: Mar. 18, 1988

[51] Int. Cl.4 .................................. H01L 33/00
[52] U.S. Cl. .................................. 357/17; 357/19; 357/56
[58] Field of Search ............... 357/17, 56, 19; 350/96.14

[56] References Cited

U.S. PATENT DOCUMENTS

| | | | |
|---|---|---|---|
| Re. 31,255 | 5/1983 | Geddes | 357/19 |
| 3,229,104 | 1/1966 | Rutz | 357/19 |
| 3,465,159 | 9/1969 | Stern | 250/213 |
| 3,952,265 | 4/1976 | Hunsberger | 331/94.5 H |
| 3,975,751 | 8/1976 | Springthorpe | 357/19 |
| 4,021,834 | 5/1977 | Epstein | 350/96.14 |
| 4,152,044 | 5/1979 | Liu | 350/96.12 |
| 4,206,468 | 6/1980 | Carballes | 357/17 |
| 4,573,161 | 2/1986 | Sakai | 357/17 |
| 4,647,953 | 3/1987 | Okajima | 357/17 |

Primary Examiner—Martin H. Edlow
Attorney, Agent, or Firm—Robert L. Nathans; Donald J. Singer

[57] ABSTRACT

The invention comprises integral all silicon light sources and 3-D optical waveguides which combine the functions of room temperature optical emission and optical signal routing. Several light emitting electrooptical silicon devices are herein disclosed. Light emitted by silicon LEDs is concentrated in channels (waveguides) and is directed to desired locations on a silicon wafer. In all of the devices, the light source is electrically actuated by a forward biased p-n junction and the light intensity can be electrically controlled by varying the applied current.

25 Claims, 3 Drawing Sheets

SILICON LIGHT-EMITTING DIODE WITH INTEGRAL OPTICAL WAVEGUIDE

TECHNICAL FIELD

This invention relates generally to integrated optical circuits and the components making up said circuits. More particularly, this invention relates to a silicon light-emitting diodes suitable for integral use with silicon optical waveguides and integrated optical circuits.

BACKGROUND OF THE INVENTION

The recent development of low loss single mode optical fibers with low dispersion at the 1.3 and 1.6 micron wavelengths has focused attention on long-wave integrated optical circuits and optical systems that couple to such fibers. Such optical circuits and systems are useful in telecommunications, data communication, optical signal processing, optical interconnection, optical sensing, and microwave antenna control applications. Semiconductor guided-wave circuits are of special interest because they can, in principle, provide optoelectronic integration; i.e., the monolithic integration of optical guided-wave components with electronic circuits and electrooptical components on a single chip.

The fundamental building blocks of such guided-wave circuits are the channel waveguides which are used to make various optical components including switches, modulators and interconnects. In all these components, it is essential to keep optical propagation losses at a minimum in order to allow multiple guided-wave components to be cascaded on one wafer without incurring a significant loss penalty.

Waveguides suitable for use in an integrated optical circuit due to their high efficiency, small size and ease of fabrication are described in our related application entitled, "Method of Fabricating Low Loss Crystalline Silicon Waveguides" (Joseph P. Lorenzo and Richard A. Soref) Ser. No. 928,349 filed Nov. 10, 1986. The method described therein provides the desired techniques for fabricating waveguides operative at 1.3 to 1.6 micron wavelengths which do not suffer from the complexity or expense of fabricating waveguides using binary, ternary or quaternary alloy compositions of various materials. In another related application, entitled "Electrooptical Silicon Devices" (Joseph P. Lorenzo and Richard A. Soref) Ser. No. 036, 822 filed Mar. 26, 1987, various silicon devices compatible with the above mentioned waveguides have been described. Other related applications include "Electrically Controlled Integrated Optical Switch" (Richard A. Soref) Ser. No. 050,358 filed May 18, 1987 now U.S. Pat. No. 4,746,183 and "Silicon Waveguide with Monolithically Integrated Schottky Barrier Photodetector" (Andrew C. Yang, Joseph P. Lorenzo and Richard A. Soref) Ser. No. 049,352 filed May 14, 1987 which describe switching and light modulating silicon devices that can be suitably integrated, manufactured and networked with low loss silicon waveguides. In addition, the last mentioned application describes an integral photodetector for use with low loss silicon waveguides. The above components allow for the routing and manipulation of optical signals as well as their conversion to electrical pulses. In view of the above, there still remains the problem of integrating conventional light emitting diodes (LEDs) and lasers with silicon waveguides.

Conventional LEDs rely on III-V compounds and the propagation of light through free space to drive signals through waveguides. In addition, intimate coupling of silicon waveguides with conventional light emitting diodes has proven to be a difficult manufacturing task and unsuitable for standard manufacture of integrated optical circuits. In general, many of these conventional optical devices require special facets or exotic growth techniques which result in a relatively high cost of manufacture. This effectively prevents the placing of conventional laser and light-emitting diodes within integrated optical circuits.

A need therefore exists for an improved light-emitting diode suitable for use in integrated optical circuits and particularly optical circuits utilizing silicon waveguides.

A further need exists for a light-emitting diode suitable for intimate coupling with silicon waveguides and which is suitable for use where desired in integrated optical circuits.

Finally, the need exists for an inexpensive light-emitting diode for use with integrated optical circuits.

SUMMARY OF THE INVENTION

The invention comprises an integral silicon light-emitting diode and optic waveguide. More specifically, the preferred embodiment of the invention comprises an electrooptic silicon device formed on a silicon substrate having three doped silicon layers. The second of the three silicon layers is formed into an optical waveguide and the third layer is positioned on said optical waveguide in order to form a p-n junction with the second layer. A first electric contact is connected to the second layer and a second electric contact is electrically connected with the third layer. These electric contacts are in turn, connected to a power source that provides electrical energy to the p-n junction in order to cause the p-n junction to emit light directly into the optical waveguide.

In a particular preferred embodiment of the invention a dielectric layer is positioned between the first and second silicon doped layers in order to increase confinement of light emitted by the p-n junction in the optical waveguide. In another preferred embodiment, the dielectric layer is cut back, away from the optical waveguide, in order to permit electric contact between the first and second doped silicon layers. This permits use of standard surface contacts to connect the p-n junction to the power source.

In the preferred embodiment of the invention, the first layer is formed of n+ crystalline silicon, the second layer is formed of n type silicon and the third layer is made of p+ type silicon.

In one preferred embodiment of the invention, an etched facet is positioned adjacent to the p-n junction in order to reflect light emitted by the p-n junction in a preferred direction along the waveguide. In another preferred embodiment, a cleaved and coated waveguide end is positioned adjacent to the p-n junction to reflect light in a preferred direction along the optical waveguide.

In yet another preferred embodiment of the invention, the p-n junction is positioned transverse to the light propagation axis of the optical waveguide in order to transfer a high proportion of the emitted light to the preferred light propagation axis of the optical waveguide.

Yet a further embodiment of the invention comprises an optical waveguide having both a light emitting p-n junction and an active reflective area. The active reflective area is positioned adjacent to the light emitting p-n junction for selectively directing light emitted by the p-n junction in a preferred direction along the optical waveguide.

In other preferred embodiments of the invention, the light emitting electrooptic silicon device is positioned in a location where light can be directed to multiple optical waveguides and to multiple exit ports. In some of these embodiments light can be selectively directed to one or several of said optical waveguides.

It is an object of this invention, therefore, to provide combined silicon light emitting diodes and waveguides suitable for use in integrated optical circuits. It is an advantage of this invention that integral silicon optical sources are less expensive to manufacture than conventional III–V compound light emitting devices.

It is a further object of this invention to provide a variety of light emitting silicon devices for use in a variety of waveguides in order to show the versatility of intimate silicon light emitting diodes and waveguides structures. It is an advantage of this invention that these structures can be placed virtually anywhere in integrated optical circuits without requiring special facets or exotic growth techniques.

It is a further advantage of this invention that devices made according to the principles of this invention are easy to manufacture and have a lower rejection rate than comparable heterojunction semiconductor devices.

BRIEF DESCRIPTION OF THE DRAWINGS

The foregoing and other objects and advantages of the invention will be apparent from the following more particular description of the preferred embodiments of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE INVENTION

Figure 1:
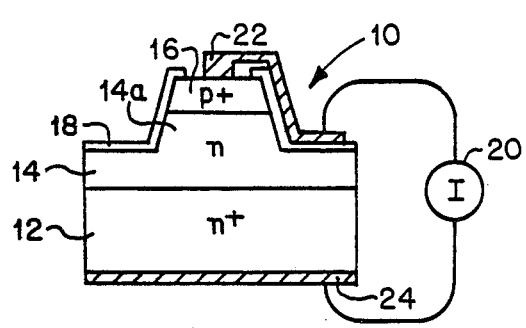
FIG. 1 is a cross-sectional schematic of a waveguide with an integral light emitting diode, which embodies the principles of this invention.

There is a need for an all-silicon guidedwave technology including optical sources, detectors, switches, modulators, waveguides and other integrated optic components. While III–V epitaxy on silicon is possible, an all silicon approach such as silicon epitaxy or silicon on insulator is much simpler and therefore desirable. With the advent of silicon waveguides there is a need for silicon optical sources. This requires electrically controlled emitters that radiate light in the spectral region where silicon is transparent so that the light may be channeled to desired locations. High power emission is not a requirement because in most applications, the trapped light will not be sent over large distances.

A variety of III–V laser structures use optical waveguides, but we have constructed the first waveguided silicon sources. The invention comprises integral all silicon light sources and 3-D optical waveguides which combine the functions of room temperature optical emission and optical signal routing. Several light emitting electrooptical silicon devices are herein disclosed. Light emitted by silicon LEDs is concentrated in channels (waveguides) and is directed to desired locations on a silicon wafer. In all of the devices, the light source is electrically actuated by a forward biased p-n junction and the light intensity can be electrically controlled by varying the applied current.

The emission wavelength of these light emitting silicon devices, described below, is centered about 1.15 microns. Our experiments have indicated that this emission is in the transparent region of crystalline silicon used for the optical waveguides throughout this disclosure. It should be noted, however, that other optical waveguides could be used, such as those made out of glass and other transparent materials. Since the light emitter is a transparent integral part of the silicon wafer, it has the advantage of allowing optical signals of other wavelengths (1.3–1.6 microns for example) to pass through unimpeded. The electroluminescence function of the coupling waveguide and LED can therefore be independent of other routed optical signals.

A few specific structures are shown in FIGS. 1–12. All make use of novel silicon waveguides and ribs to guide emissions resulting from electroluminescence in silicon. Although electroluminescence in silicon is known, silicon photodiodes are relatively low efficiency devices. Reverse (biased) electroluminescence is visible and forward-biased electroluminescence has a spectrum peak near 1.1 microns. It had not been recognized prior to this invention that the forward-biased electroluminescence has a long wavelength tail that can be waveguided in the transparent spectral region of silicon. We have found that 1.15 micron emissions are very useful for waveguide transmissions. These emissions have been channeled into such silicon waveguides to concentrate the light. Although researchers have experimented with silicon in hopes of obtaining efficient LEDs, so far as we know, none have tried to guide these emissions within silicon waveguides. This has made a heretofore merely interesting electroluminescence property into a very useful technology.

There are, however, ways to shift silicon electroluminescence into longer wavelengths as well as ways to advance the quantum efficiency of the emitter. Research in Germany and the United States on photoluminescence and electroluminescence has shown that rare earth doping can give 1.5 micron emissions. Other research has shown that Beryllium implants on silicon increases the silicon luminescence efficiency over boron/phosphorus doping. Our inventions, however, chiefly relate to concentrating the electroluminescence emissions by directing them in crystalline silicon waveguides which are in intimate contact with the silicon LEDs.

Illustrated in FIGS. 1-12 are a variety of integral waveguide and silicon LED structures which embody the principles of this invention. Some of these devices have specific advantages for use in particular integrated optical circuits.

FIGS. 1-4 are cross-sectional schematics of integral waveguides and light emitting diodes. These figures represent four different approaches to integral waveguide and LED construction.

FIG. 1 is a cross-sectional representation of an epitaxial waveguide and LED structure 10. A first layer of n+ doped silicon is formed from the silicon substrate. On top of the first layer 12 is a crystalline waveguide layer 14 of n type silicon. The waveguide layer has been formed by etching or other means to produce a waveguide rib 14a. A layer of p+ type silicon 16 has been formed on top of the waveguide rib 14a to produce a p+/n junction. Radiative recombination under the forward-biased junction produces long-wave light that is confined and channeled by the waveguide 14. The waveguide layer 14 is bounded on top by a passivating layer 18 and the p+/n junction is connected to a current supply 20 by electrodes 22 and 24. Note that the n+ type silicon is electrically conductive and connects the n type silicon (forming the waveguide) to the current supply 20.

Figure 2:
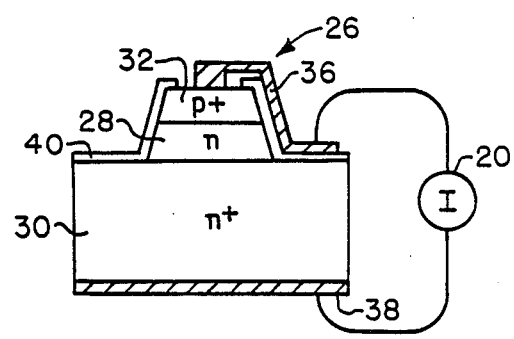
FIG. 2 is a cross-sectional schematic of another waveguide with an integral light emitting diode incorporating the principles of this invention.

FIG. 2 shows an epitaxial waveguide LED structure similar to that described in FIG. 1. The waveguide structure 26 of FIG. 2 is slightly modified from that of FIG. 1, in that the epilayer waveguide 28 is etched all the way through the n type layer, so that light is less likely to leak into the underlying n+ layer 30. As in FIG. 1, a p+/n junction is formed on the waveguide by a p+ type layer 32 that is electrically connected to a current source 20 by electrode 36. The n type side of the junction is connected to the current source with an electrode 38. Passivating layer 40 covers the exposed silicon of the waveguide structure.

Figure 3:
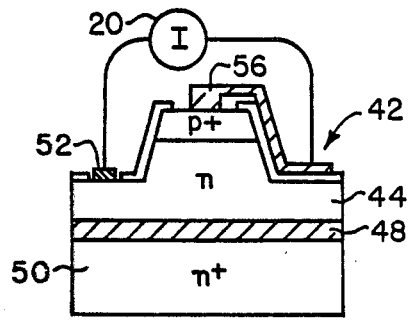
FIG. 3 is a cross-sectional schematic of a light emitting diode and waveguide of this invention in which a dielectric layer is used to contain light within the waveguide.
Figure 4:
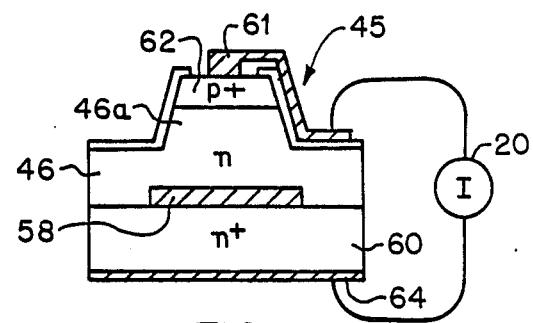
FIG. 4 is a cross-sectional schematic of a light emitting diode and waveguide in which a dielectric is used to contain light within the waveguide while permitting easy electrical contact to the light emitting area.

In the views of FIGS. 3 and 4, light is strongly confined to waveguide layers 44 and 46, respectively by dielectric layers 48 and 58. In structure 42 of FIG. 3, the dielectric layer of silicon dioxide 48 is formed between the underlying slab 50 and the waveguide layer 44. Since the dielectric layer prevents electrical contact between silicon layers 44 and 50 a surface contact 52 is required to electrically connect the n side of the p/n junction to the current supply 20. Electrode 56 is used to connect to the p+ layer. In device 45 of FIG. 4, the dielectric layer 58 is cut back in areas away from the waveguide 46a, in order to allow electrical contact between the substrate layer 60 and the waveguide layer 46. This permits use of conventional opposing surface contacts similar to those shown in FIGS. 1 and 2, specifically a top surface contact to the p+ layer 62 and an underside surface contact 64 connected to the substrate 60.

Figure 5:
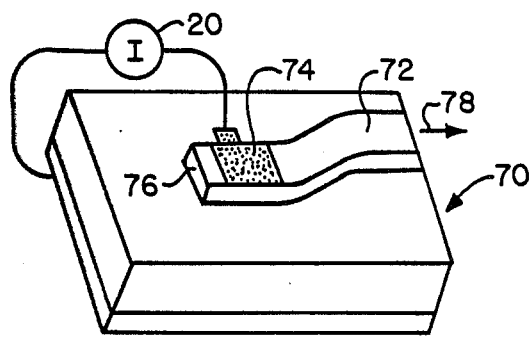
FIG. 5 is a perspective view of a light emitting diode and waveguide of this invention in which light is directed into the waveguide in a preferred direction.
Figure 6:
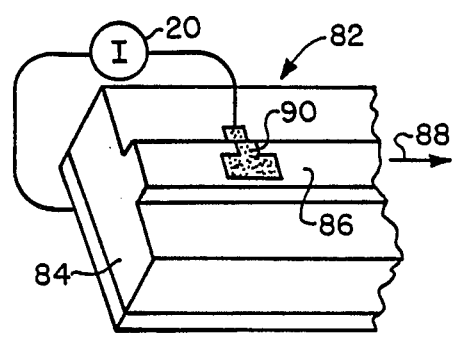
FIG. 6 is a perspective view of an embodiment of this invention in which the waveguide and light emitting area are positioned on a crystalline silicon chip having a cleaved end that reflects light in a preferred direction.
Figure 7:
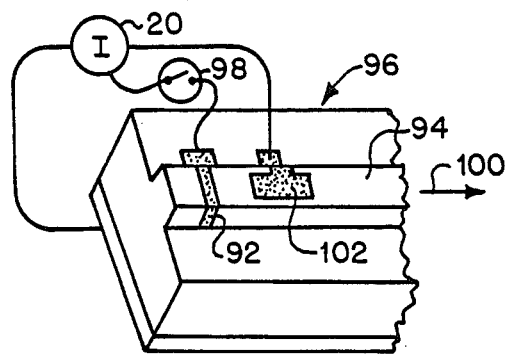
FIG. 7 is a perspective view of a waveguide and light emitting area in which a selectively reflective element is positioned in the waveguide to selectively direct light in a preferred direction along the waveguide.

Since light is emitted by the silicon LEDs isotropically, it can "fan out" from a central location and to several waveguides, or the light can be funneled in one direction by means of reinforcing mirrors. FIGS. 5, 6, and 7 disclose waveguides with integral light emitters and reflective means for directing the emitted light in a desired direction along the light propagating axis of the waveguide. This axis, unless otherwise stated, is the longitudinal axis of the waveguide rib as represented in the figures.

FIG. 5 is a perspective view of the device 70 having a waveguide rib 72 including an integral light emitter 74. The waveguide rib 72 has an etched facet 76 which serves as a reflector to direct light in a preferred direct in the waveguide. This increases the optical power of the signal transmitted through waveguide 72 (the signal is schematically shown by arrow 78). The light emitting area can be constructed in accordance with the structures shown in views 1, 2, and 4 and is connected to a current source 80.

A similar increase in optical power is obtained by device 82 shown in FIG. 6. In this integral light emitting waveguide device 82, one end of the silicon wafer is optically polished or cleaved along surface 84. Note that multilayered dielectric coatings or metal films could be used to make this surface as high as 95% reflective. Light is therefore directed in waveguide 86 in the direction shown by arrow 88. The light emitting diode 90 once again is formed in accordance with the cross sections shown in FIGS. 1, 2, and 4.

FIG. 7 illustrates the use of an active reflector 92 integrated into the waveguide 94 of electrooptical device 96. This is done by locally doping the guide or building up an electrically controlled p/n junction across the guide at location 92. Use of such as reflective switching area is fully disclosed in our application Ser. No. 050,358 filed 18 May 1987 and entitled "Electrically Controlled Integrated Optical Switch, now patent number 4,746,183" which is hereby incorporated by reference. By controlling the active reflector 92 with a switch 98 at current source 20 the light signal 100 emitting from the optical waveguide 94 could be easily modulated. The signal is modulated by alternately activating reflector junction 92 to reflect the signal in a preferred propagation direction through the waveguide 94. The result would be to emit modulated light in an end-fire fashion from the guide. Since the optical reflective coefficient due to the silicon doping can be very low it may be advisable to grow GeSi in a trench, or to ion implant germanium ions across the waveguide to create a more reflective wall with a Ge/Si heterostructure.

Figure 8:
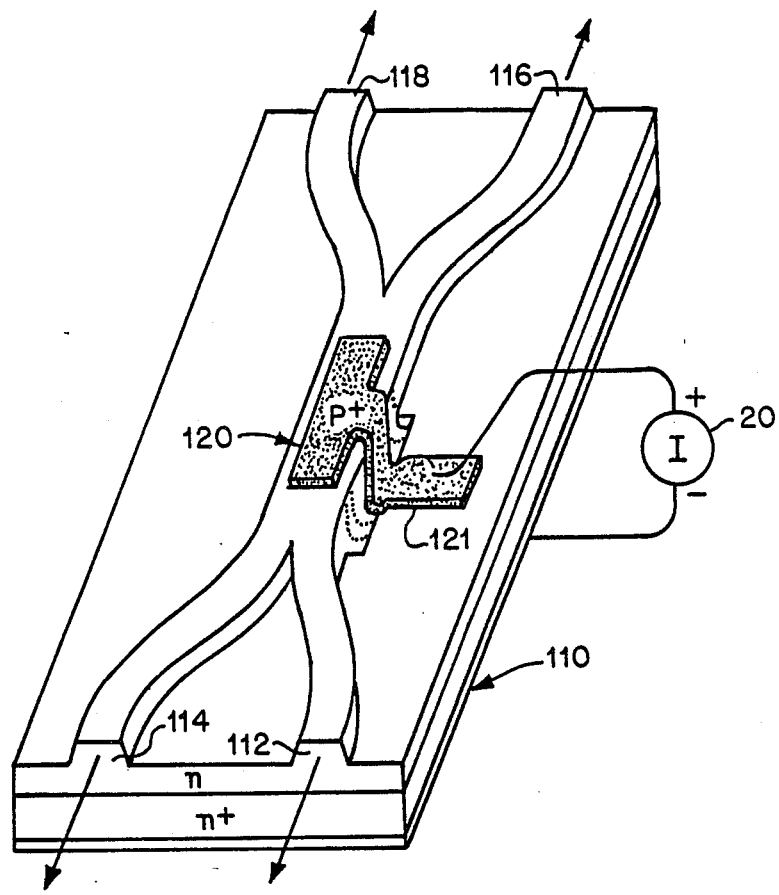
FIG. 8 is a perspective view of a light emitting diode integral with a multi-port optical waveguide.

FIG. 8 shows a structure 110 having four n/n+ epitaxial silicon waveguides 112, 114, 116 and 118. This is an example of a multiguided emission from a localized diode region 120 and shows a structure that has been extensively tested and therefore will be described in extensive detail. In this structure 110, a p+/n/n+ diode 120 has been integrated into the intersection of two n/n+ rib channel optical waveguides that were formed by plasma etching n/n+ epitaxial silicon. The n type ribs are doped with antimony (Sb) at $n_d = 7.5 \times 10^{15} \text{cm}^{-3}$ and the n+ substrate has antimony doping at $2 \times 10^{19} \text{cm}^{-3}$. The rib crossing angle was 2.2°. In this representative device, the ribs were 15 microns wide and the rib walls were etched 1.5 microns deep in a 6 micron epilayer. Boron ($N_a = 5 \times 10^{19} \text{cm}^{-3}$) was diffused 0.5 microns deep into the top surface of the intersection 120 to form a p+/n junction 1500 microns long and 30 microns wide. This large area p+/n/n+ diode was forward biased to inject holes (or electrons and holes at high injection) into the n type waveguides. Radiative recombination of these carriers therein took place.

Light is emitted isotropically across the entire junction area. Less than 1% of the light is emitted into the air at the two exposed junction edges. Approximately half the light is emitted directly below the junction. The other half is emitted above the junction plane where it strikes the metal/p+ contact 121 and is reflected downward through the junction. More than 99% of the surface emitted light penetrates into the n+ substrate and is scattered diffusely throughout the substrate. The remaining faction (high angle emission) was trapped in the planar epilayer waveguide via total internal reflection at the substrate-epilayer interface where the refractive-index step is 0.018. A portion of the slab-guided light is trapped laterally by the rib walls and waveguided in 3-D fashion along the channels to the polished ends of the ribs where the light is emitted into the air. From the p/n junction to the waveguide end the light traveled over a 1 milimeter path in silicon.

An infrared vidicon was used to obtain a television image of the near field emission pattern at a dual channel end of the silicon chip. Highly multimode channelized emission that fills the numerical aperture of the ribs has been observed. Slab-guided light in the 4.5 micron platform was also observed because the numerical aperture of the emission was larger than the rib numerical aperture. It is possible, as we have shown in FIG. 2, to etch the rib walls all the way down to the n/n+ interface producing raised strip waveguides. In the strip waveguide, the slab guided light is eliminated, and the strip or waveguide emission, is more intense. This can also be accomplished by including a dielectric layer as shown in FIGS. 3 and 4.

Radiative recombination at silicon p/n junctions is known to emit an infrared spectrum that extends from 0.95 microns to 1.3 microns. In our present device a portion of that spectrum is guided by optical waveguides in order to be concentrated as a usable output while another portion of the spectrum is self-absorbed because the light must travel along the silicon path discussed above. Light whose wavelength is shorter than 1.1 microns (the indirect bandgap wavelength) is absorbed via a band to band process. Because silicon is transparent beyond 1.1 microns wavelength, the remainder of the spectral power is transmitted along the channel and exits the guide. The device shown in FIG. 8 was not optimized as a guided emitter and did not have a particularly high efficiency, however, an improved geometry is shown in FIG. 9.

Figure 9:
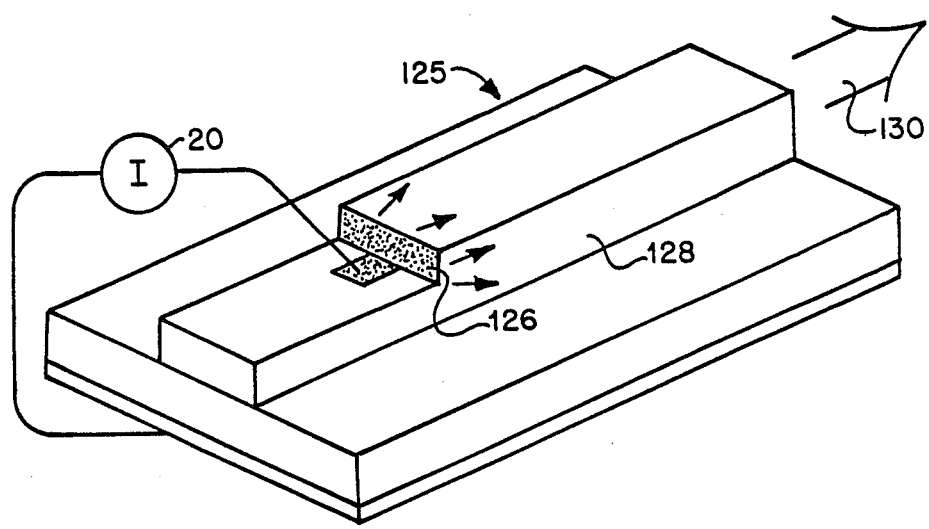
FIG. 9 is a perspective view of an integral optical waveguide and light emitting diode in which the light emitting junction is transverse to the axis of light propagation of the waveguide.

The perspective view of FIG. 9 shows an integral light emitting waveguide device 125 where the light emitting p/n junction 126 is diffused into a vertical wall so that it forms a height step in the strip waveguide 128. Exemplary dimensions are a 3 micron high junction 126 in a 6 micron high strip 128. Here the junction plane is at 90° to the channel axis of light propagation (shown by arrow 130) and the junction radiates primarily along the axis of the waveguide. In this way, more than 50% of the total emission is captured by the guide. Thus the efficiency of this device is much higher than the device of FIG. 8. It is expected that within a junction area 1/500 of the area of that shown in FIG. 8, the optical output of the junction of FIG. 9 would be twice as large per (waveguide) cannel. At the same time the electrical power needed in device 125 is substantially lower than that needed to activate the junction of FIG. 8.

Figure 10:
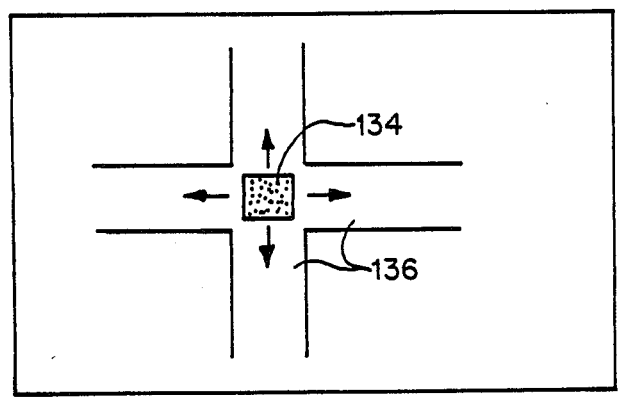
FIG. 10 is a schematic top view of a light emitting diode integral with orthogonal waveguide outputs.
Figure 11:
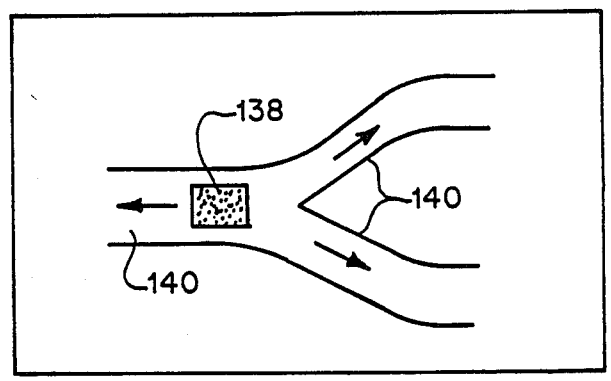
FIG. 11 is a schematic top view of a light emitting diode integrated with a three output optical waveguide.
Figure 12:
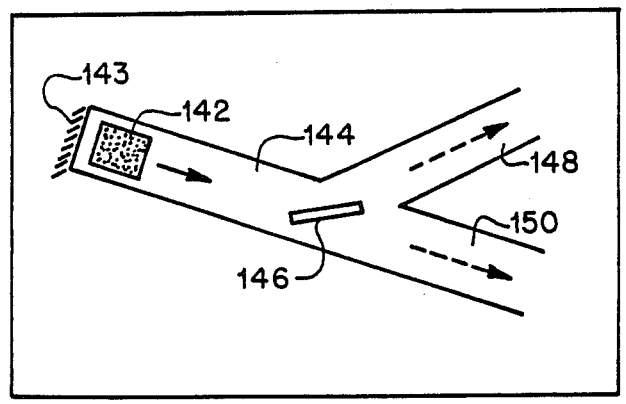
FIG. 12 is a schematic top view of a light emitting diode integrated on the optical input channel of a 1×2 electrooptic internally reflective switch.

FIGS. 10 through 12 illustrate top views of multi-guided emissions from localized diode regions constructed according to the procedures discussed in references to FIGS. 1–4 and 8. In FIG. 10, diode 134 has four orthogonal outputs 136. In FIG. 11 light emitting region 138 has three outputs 140. FIG. 12 demonstrates the integration of an LED 142 with a 1×2 electrooptic total internal reflection (TIR) switch. Light emitted from LED 142 is reflected by cleaved end 143 and is passed through channel 144 until it reaches the active region of the switch 146. Here a p/n junction is formed according to the principles referred to above in our above referenced prior application Ser. No. 050,358 to selectively direct light to channel 148 or 150 by actuating the switch vane. The guided LED output is thereby switched into the upper waveguide 148 or the lower waveguide 150.

It should be noted that with these devices 2×2 switching is feasible as well as passing of optical signals in the 1.3 or 1.6 micron wavelength range directly under the light emitting junction without substantial distortion. This is because the all silicon LED is fairly transparent to additional optical signals.

A useful feature of the waveguide and integral LED of this invention is that waveguided signals are detectable with a silicon Schottky-barrier photodiode integrated directly on a silicon waveguide as disclosed in our application Ser. No. 049,352 filed 14 May 1987 to Yang, Lorenzo, and Soref; entitled "Silicon Waveguide with Monolithically Integrated Schottky Barrier Photodetector."

All of the above devices have many advantages over the conventional LED optical signaling structures. Both the waveguide and the light emitting areas are manufactured from homogeneous silicon so that manufacturing is much more standardized, less expensive, and easier to do. Difficult to manufacture III-V compounds have been eliminated as well as exotic facet and growth techniques. With the intimate coupling of the silicon LED with the waveguide, the relatively low efficiency silicon LEDs can be used effectively in integrated optics technology. These integrated LED areas can be placed virtually anywhere on an integrated optical circuit. When used in combination with photodetectors, these light emitting diodes offer the possibility of truly integrated electrooptical circuits where electrical signals are converted to optical signals and reconverted back to electrical signals (if desired) on a single chip.

While the invention has been described with reference to the preferred embodiments thereof it will be understood by those skilled in the art that various changes in substance and form can be made herein without departing from the spirit and scope of the invention as detailed in the appended claims.

We claim:

1. An electrooptic silicon device having a longitudinal axis comprising:

a first doped silicon layer;

a second doped silicon layer positioned upon said first layer wherein said second silicon layer is formed into an optical waveguide;

a third doped silicon layer positioned at said optical waveguide wherein said third doped silicon layer forms a p-n junction with said second doped silicon layer;

a first electric contact electrically coupled to said second silicon layer;

a second electric contact electrically coupled to said third silicon layer; and a power source for forward biasing said p-n junction through said first and second electrical contacts in order to cause said p-n junction to emit light directly into said optical waveguide.

2. The electrooptic silicon device of claim 1 further comprising a dielectric layer positioned between said first and second doped silicon layers in order to help confine light emitted by said p-n junction to said waveguide.

3. The electrooptic silicon device of claim 2 wherein said dielectric layer is cut back in order to electrically connect said first and second doped silicon layers.

4. The electrooptic silicon device of claim 1 wherein said first doped silicon layer comprises n+ doped crystalline silicon and wherein said second doped silicon layer comprises n doped crystalline silicon.

5. The electrooptic silicon device of claim 1 wherein said optical waveguide is further characterized by an etched facet adjacent to said p-n junction which directs light emitted by said p-n junction in a preferred direction along said waveguide.

6. The electrooptic silicon device of claim 1 wherein said optical waveguide is further characterized by a cleaved end adjacent to said p-n junction which directs light emitted by said p-n junction in a preferred direction along said waveguide.

7. The electrooptic silicon device of claim 1 wherein said optical waveguide is further characterized by an active reflective surface adjacent to said p-n junction which selectively directs light emitted by said p-n junction in a preferred direction along said waveguide.

8. The electrooptic silicon device of claim 1 wherein said optical waveguide is further characterized by multiple exit ports for directing light away from said p-n junction.

9. The electrooptic silicon device of claim 8 wherein said optical waveguide is further characterized by a second p-n junction which is used to switch light between said multiple exit ports.

10. The electrooptic silicon device of claim 1 wherein said p-n junction is positioned transverse to said longitudinal propagation axis of said waveguide in order to direct light in substantially one direction along said waveguide.

11. A light emitting electrooptic silicon device comprising:

a substrate;

a crystalline silicon optical waveguide positioned on said substrate for confining and directing optical signals;

a silicon p-n junction integral with said waveguide for injecting optical signals directly into said optical waveguide;

a first electric contact electrically coupled to said p-n junction; and a second electric contact electrically coupled to said p-n junction; and a power source for forward biasing said p-n junction through said first and second electrical contacts in order to cause said p-n junction to emit light directly into said optical waveguide.

12. The light emitting electrooptic silicon device of claim 11 wherein the substrate further comprises:

a first doped silicon layer;

a second doped silicon layer positioned upon said first doped silicon layer and wherein said second silicon layer is formed into an optical waveguide; and a third doped silicon layer position at said optical waveguide wherein said third doped silicon layer forms said silicon p-n junction with said second doped silicon layer.

13. The light emitting electrooptic silicon device of claim 12 further comprising a dielectric layer positioned between said first and second doped silicon layers in order to help confine light emitted by said p-n junction to said optical waveguide.

14. The electrooptic silicon device of claim 12 wherein said p-n junction is positioned transverse to said longitudinal propagation axis of said waveguide in order to direct light in substantially one direction along said waveguide.

15. The light emitting electrooptic silicon device of claim 13 wherein said dielectric layer is cut back in order to electrically connect said first and second doped silicon layers.

16. The light emitting electrooptic silicon device of claim 12 wherein said first doped silicon layer comprises n+ doped crystalline silicon and wherein said second doped silicon layer comprises n doped crystalline silicon.

17. The light emitting electrooptic silicon device of claim 11 wherein said optical waveguide is further characterized by an etched facet adjacent to said p-n junction which directs light emitted by said p-n junction in a preferred direction along said waveguide.

18. The light emitting electrooptic silicon device of claim 11 wherein said optical waveguide is further characterized by an active reflective surface adjacent to said p-n junction which selectively directs light emitted by said p-n junction in a preferred direction along said waveguide.

19. The light emitting electrooptic silicon device of claim 1 wherein said optical waveguide is further characterized by multiple exit ports for directing light away from said p-n junction.

20. A light emitting electrooptic silicon device comprising:

a substrate;

a crystalline silicon optical waveguide positioned on said substrate for confining and directing optical signals;

a silicon p-n junction integral with said optical waveguide in order to inject optical signals into said optical waveguide;

a first electric contact electrically coupled to said silicon p-n junction;

a second electric contact electrically coupled to said silicon p-n junction; and a power source for providing electrical energy to said p-n junction through said first and second electrical contacts in order to cause said p-n junction to emit light having a wavelength greater than 1.1 microns directly into said optical waveguide.

21. An electrooptic device comprising:

a waveguide having a transparent spectral region greater than 1.1 microns in wavelength; and a forward biased silicon LED, integral with said waveguide, for producing light therein having wavelengths greater than 1.1 microns.

22. The device of claim 21 wherein said LED comprises a silicon p-n junction.

23. The device of claim 21 wherein said waveguide is made of crystalline silicon.

24. The device of claim 22 wherein said waveguide is made of crystalline silicon.

25. The device of claim 22 wherein said waveguide is made of glass.

* * * * *